US006968610B2

(12) United States Patent
Nagao et al.

(10) Patent No.: US 6,968,610 B2
(45) Date of Patent: Nov. 29, 2005

(54) ELECTRONIC COMPONENT MOUNTING DEVICE AND MOUNTING HEAD UNIT FOR ELECTRONIC COMPONENT

(75) Inventors: Kazuhide Nagao, Fukuoka (JP); Takuya Tsutsumi, Ogoori (JP); Yoshikazu Higuchi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 391 days.

(21) Appl. No.: 10/346,322

(22) Filed: Jan. 17, 2003

(65) Prior Publication Data

US 2003/0135991 A1    Jul. 24, 2003

(30) Foreign Application Priority Data

Jan. 21, 2002    (JP) .......................... P. 2002-011365

(51) Int. Cl.[7] .......................... H05K 13/04; B23P 19/00
(52) U.S. Cl. ........................ 29/740; 29/709; 29/739; 29/743; 29/832; 29/834; 29/DIG. 44; 901/41
(58) Field of Search ........................ 29/829, 832–834, 29/836, 840, 739–743, 759, 709, 711–712, 29/DIG. 44, 876, 884; 901/23, 29, 40, 41; 414/749.5, 751.1, 752.1; 294/64.1; 439/501, 439/503, 498

(56) References Cited

U.S. PATENT DOCUMENTS 5,255,429 A * 10/1993 Nishi et al. .................... 29/740
5,274,908 A *  1/1994 Suzuki et al. .................. 29/740
5,741,114 A *  4/1998 Onodera ....................... 414/783
5,864,943 A *  2/1999 Arakawa et al. ............... 29/740
6,154,954 A * 12/2000 Seto et al. ..................... 29/740
6,276,051 B1 *  8/2001 Asai et al. ..................... 29/740

FOREIGN PATENT DOCUMENTS

JP    63-291075    5/1990

OTHER PUBLICATIONS

Chai, Cheng, Sheng; Chan, Pei, Wee, Stephen; Imai, Kiyoshi, Component Placement Machine and Method Thereof, International Application No. PCT/SG01/00191, International Publication No. WO 02/28161 A1, Publication Date of Apr. 4, 2002.*

* cited by examiner

*Primary Examiner*—David P. Bryant
*Assistant Examiner*—Sarang Afzali
(74) *Attorney, Agent, or Firm*—Pearne & Gordon LLP

(57) ABSTRACT

A mounting head unit for an electronic component for making a pick-up operation of the electronic component and loading operation thereof is removably attached to a head mounting bracket of an electronic component mounting device. Each mounting head unit is provided with a control board for controlling the a mounting mechanism including a plurality of unit mounting heads each equipped with an adsorption nozzle for holding the electronic component. In the mounting operation, on the basis of the operation command from a main unit control section for controlling the entire operation of the electronic component mounting device, the control board controls the operation of each of the unit mounting heads. In this way, the replacement of wirings in replacing the mounting head can be easily made and the time delay in signal processing can be removed to realize the high speed operation.

13 Claims, 7 Drawing Sheets

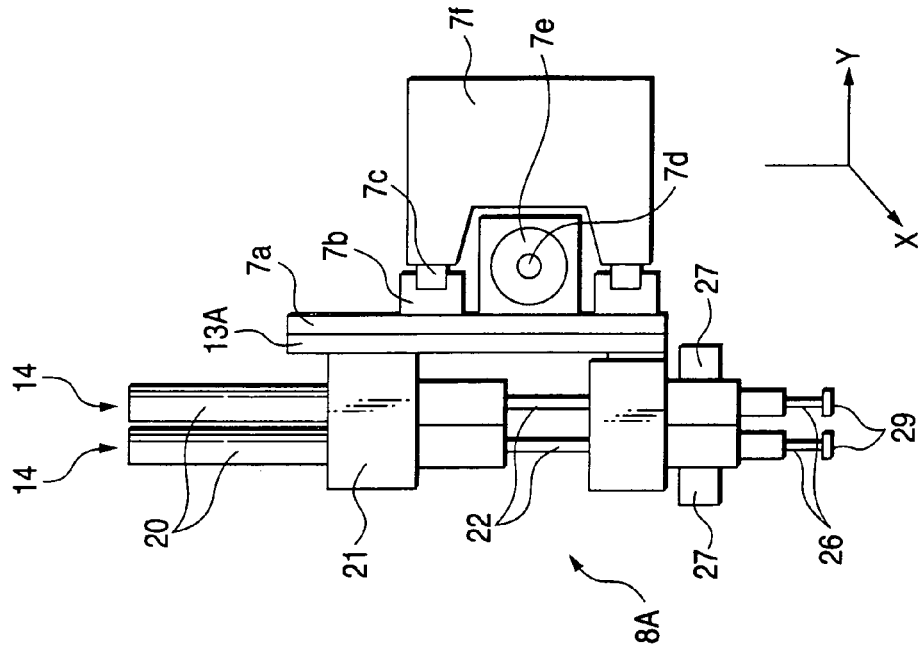
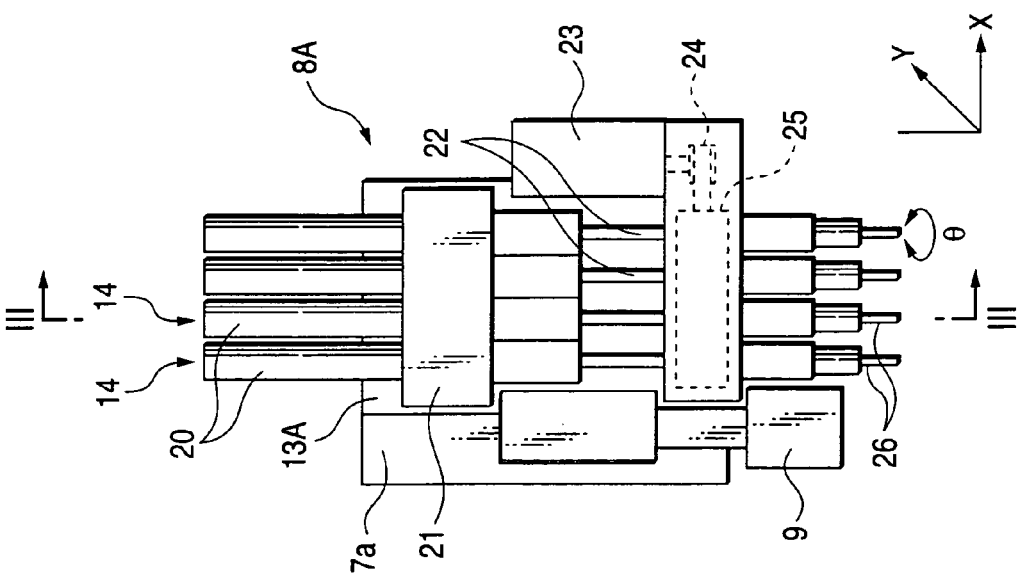

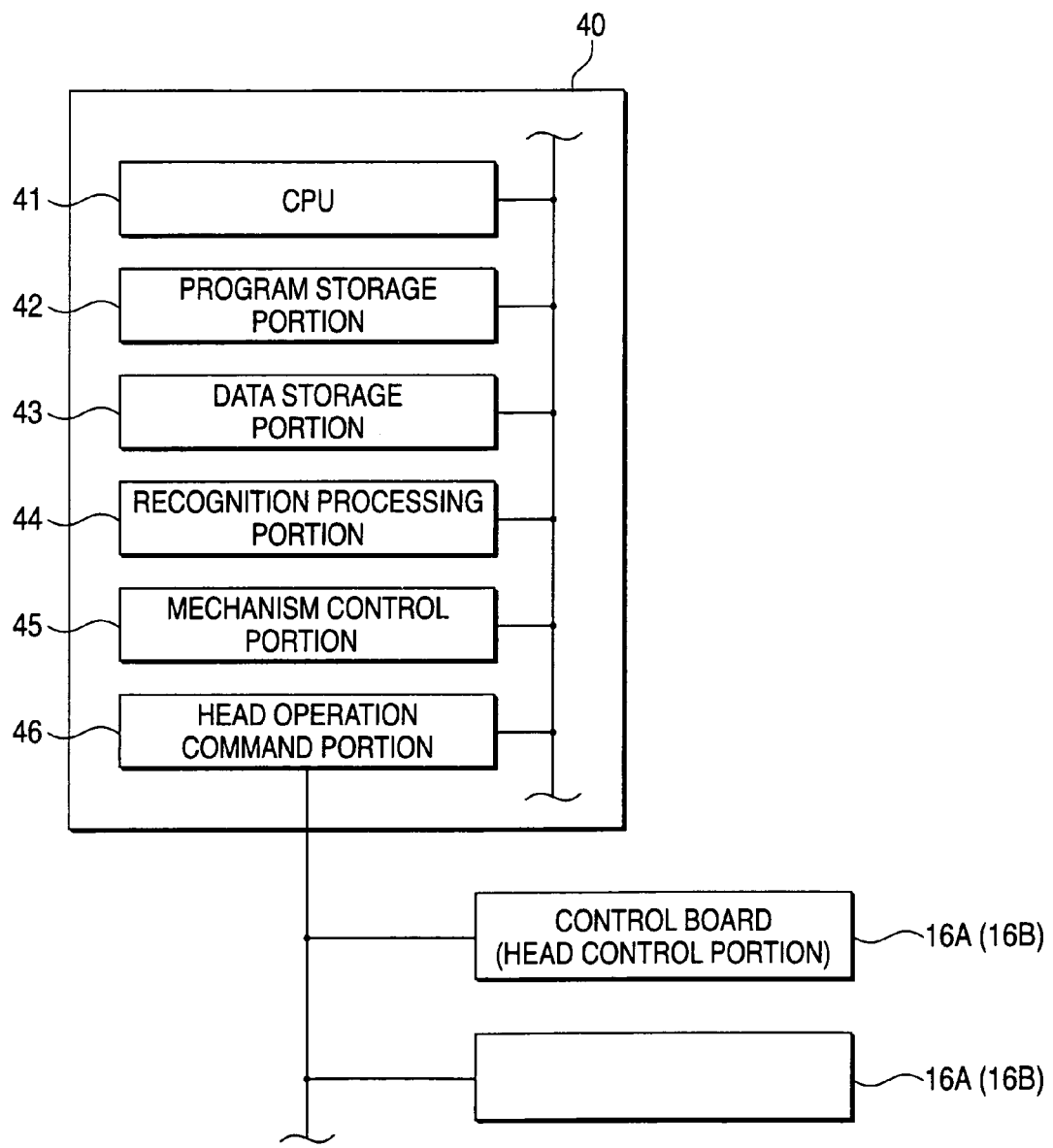

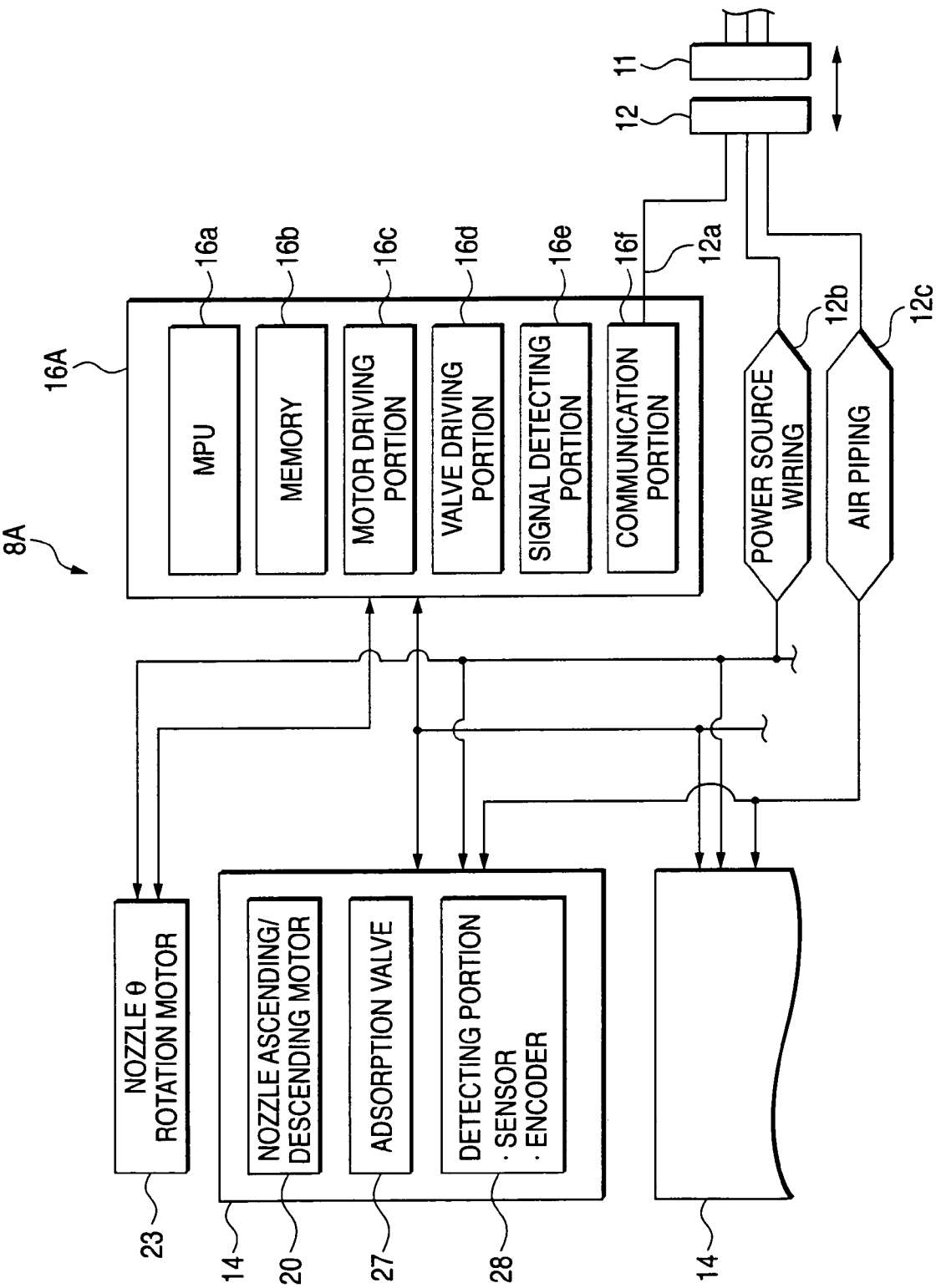

ELECTRONIC COMPONENT MOUNTING DEVICE AND MOUNTING HEAD UNIT FOR ELECTRONIC COMPONENT

BACKGROUND OF THE INVENTION

The invention relates to an electronic component mounting device for mounting an electronic component on a substrate and a mounting head unit for an electronic component.

The electronic component mounting device is provided with a mounting head which holds an electronic component picked up from a component supply section by a holding unit such as vacuum adsorption and shifts and loads the electronic component on a substrate. The mounting head is provided with various actuators such as an ascending/descending mechanism and adsorption mechanism for moving up and down an adsorption nozzle for adsorbing/holding the electronic component, and sensors for detecting signals necessary for the operation of these actuators. A control section receives the signals from these sensors and sends driving signals to the actuators to perform the mounting operation such as pick-up and loading of the electronic component. Conventionally, such control of the operation of the mounting head has been performed by a main unit control section for controlling the entire operation of the electronic component mounting device.

However, in the above electronic component mounting device, the transmission/reception of the above signals must be made between the main unit control section which is fixedly arranged and the mounting head which is movable, and many wirings such as a power supply wiring and various signal wirings are routed complicatedly using a cable bear and others. Therefore, when the mounting head is exchanged for another, connection of these wirings must be changed. This makes it very difficult to replace the mounting head by a different package head by the same electronic component device.

In a control system for the above component mounting device, all of many control objects such as a plurality of mounting heads and a substrate transfer mechanism are controlled by the main unit control section. The time delay due to this leads to response delay in a mounting operation, thereby impeding a high speed operation.

SUMMARY OF THE INVENTION

The invention intends to provide an electronic component mounting device and a mounting head unit for an electronic component which can facilitate the exchange of a packing head and a high speed operation.

The electronic component mounting device according to this invention is an electronic component mounting device for taking out an electronic component from a component supply section and shifting and loading the electronic component onto a substrate, comprising a substrate positioning section for positioning the substrate; a mounting head unit, detachably mounted on the electronic component mounting device, for making a pick-up operation of picking up and holding the electronic component from the component supply section and a loading operation of loading the electronic component thus held on the substrate; and a main unit control section for controlling an entire operation of the electronic component mounting device, wherein the mounting head unit comprises a component holding means for holding the electronic component; a mounting operation mechanism for allowing the component holding means to make a mounting operation inclusive of the pick-up operation and loading operation; and a head control section for controlling the mounting operation mechanism on the basis of an operation command from the main unit control section.

The mounting head unit for an electronic component according to this invention is a mounting head unit for an electronic component for making a pick-up operation of picking up and holding an electronic component from a component supply section and a loading operation of loading the electronic component thus held on a substrate in an electronic component mounting device, the mounting head unit comprises: a component holding means for holding the electronic component; a mounting operation mechanism for allowing the component holding means to make a mounting operation inclusive of the pick-up operation and loading operation; and a head control section for controlling the mounting operation mechanism on the basis of an operation command from the main unit control section, and the mounting head unit is detachably mounted on the electronic component mounting device.

In accordance with this invention, the mounting head unit removably mounted in the electronic component mounting device includes a component holding means for holding an electronic component, a mounting operation mechanism for causing the component holding means to make a mounting operation inclusive of the pick-up operation and loading operation; and a head control section for controlling the mounting operation mechanism on the basis of an operation command from the main unit control section for controlling the entire operation of the electronic component mounting device. In such a configuration, replacement of the mounting head can be easily made and the high speed mounting operation can be realized.

BRIEF DESCRIPTION OF THE DRAWINGS

FIGS. 3A and 3B are views showing the structure of a mounting head unit of an electronic component mounting device according to the embodiment of the invention;

FIG. 5 is a block diagram showing the configuration of the control system of an electronic component mounting device according to the embodiment of the invention;

FIG. 6 is a block diagram showing the configuration of the mounting head unit of an electronic component mounting device according to the embodiment of the invention.

DETAILED DESCRIPTION OF THE PREFERRED EMBODIMENT

Figure 1:
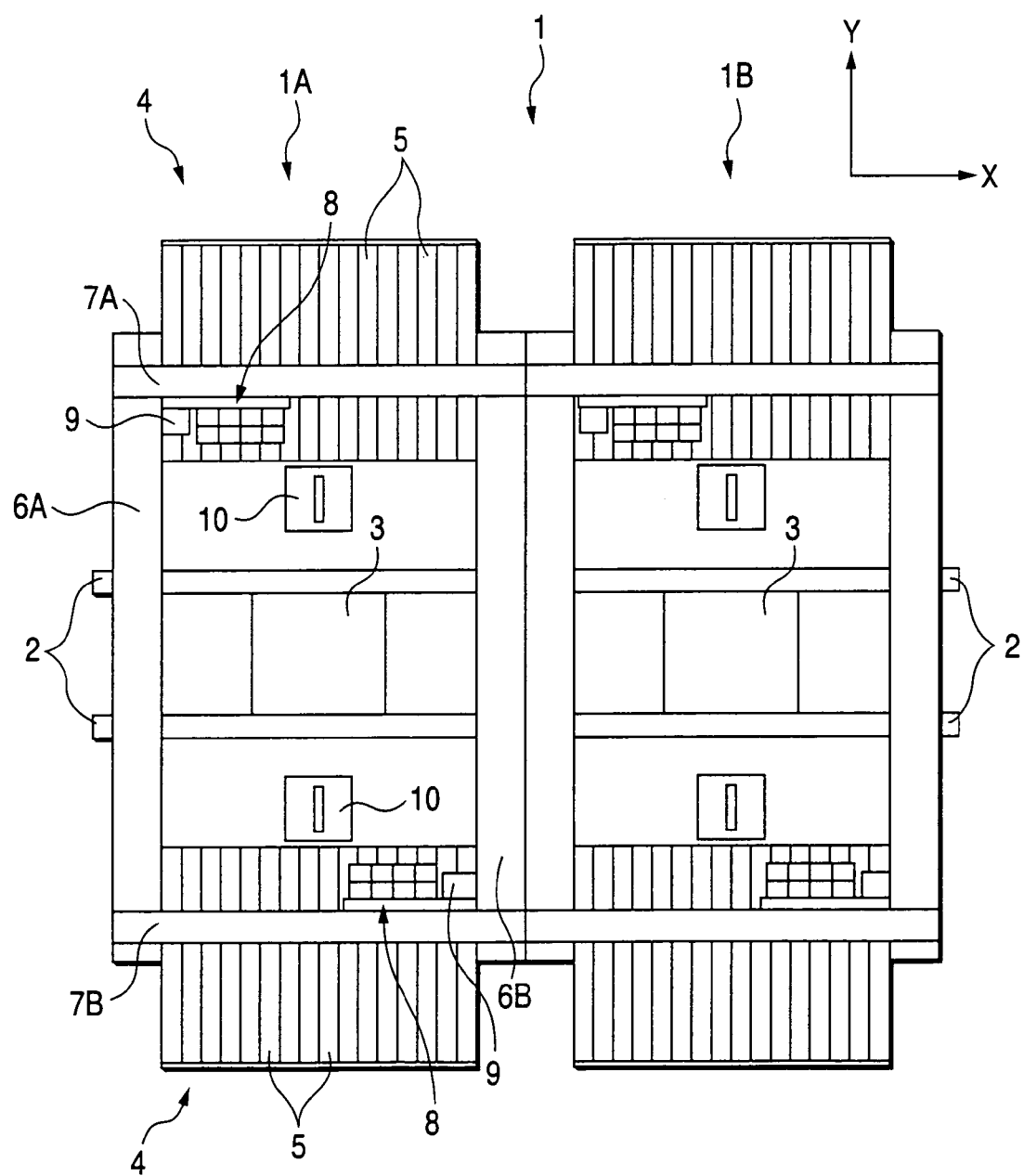
FIG. 1 is a plan view of an electronic component mounting device according to an embodiment of the invention.
Figure 2A:
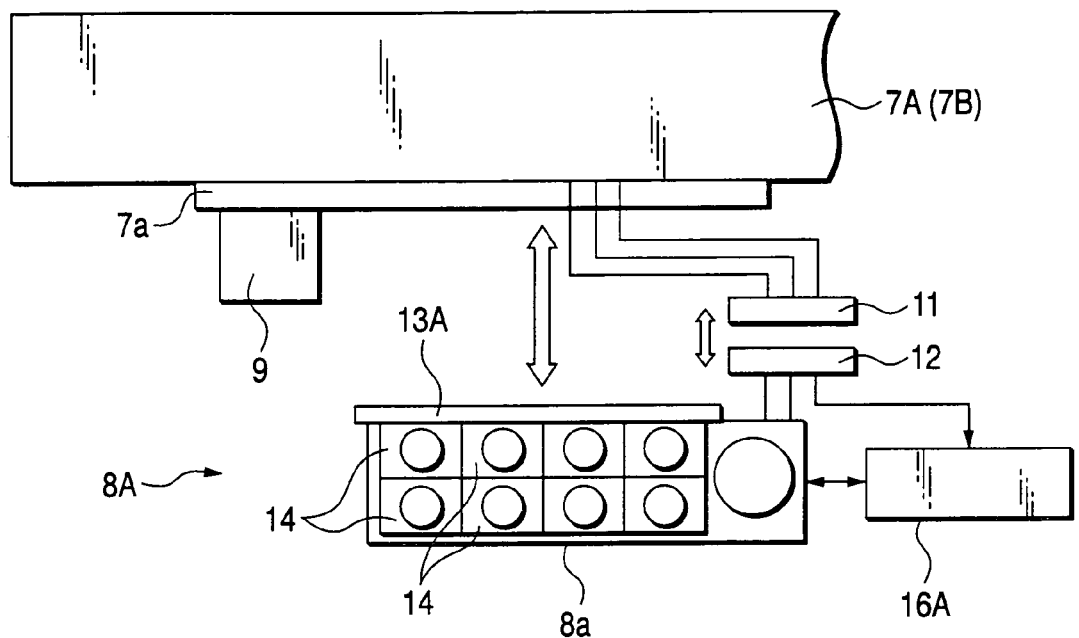
FIGS. 2A and 2B are plan views of an X-axis table and a mounting head of an electronic component mounting device according to the embodiment of the invention.
Figure 2B:
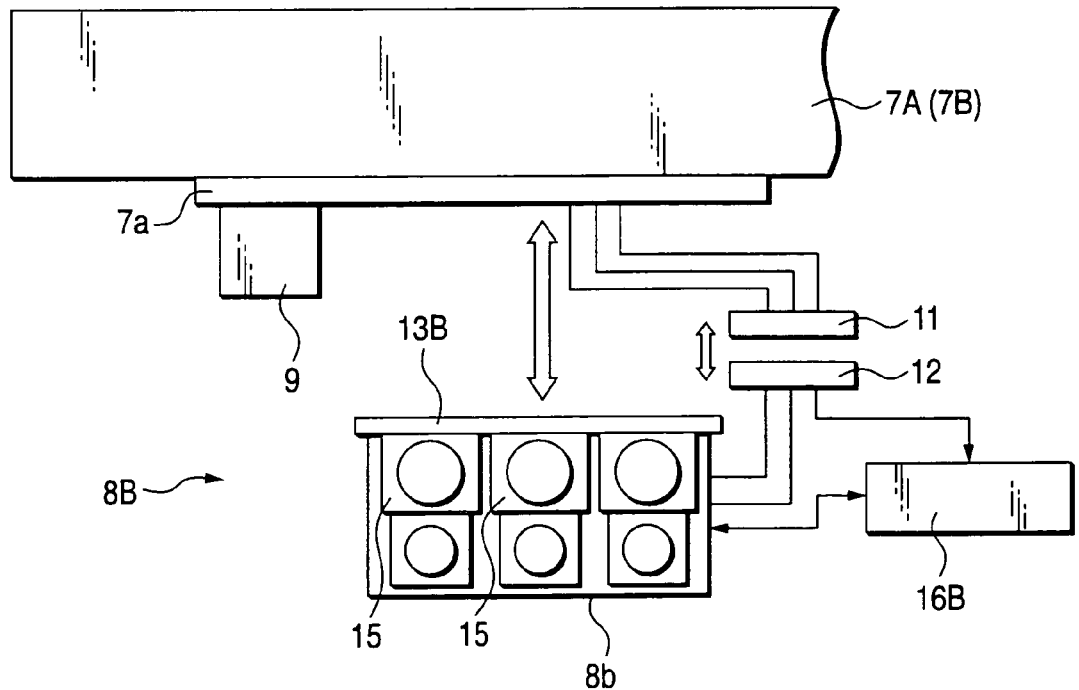
Figure 7:
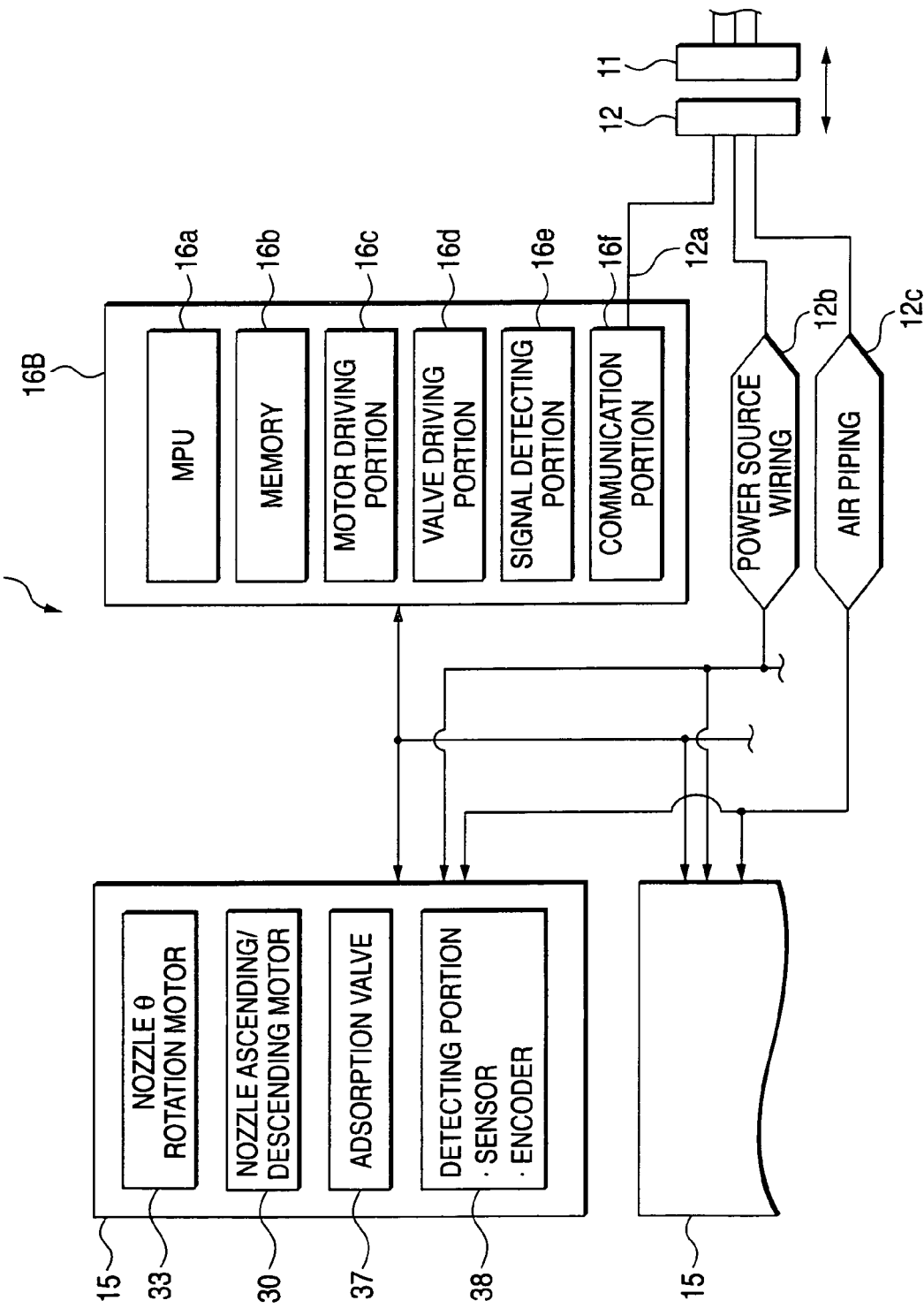
FIG. 7 is a block diagram showing the configuration of the mounting head unit of an electronic component mounting device according to the embodiment of the invention.

Now referring to the drawings, an explanation will be given of various embodiments of this invention. FIG. 1 is a plan view of an electronic component mounting device according to the invention. FIGS. 2A and 2B are plan views of an X-axis table and a mounting head of an electronic component mounting device according to the invention. FIGS. 3A, 3B, 4A and 4B are views showing the structure of a mounting head unit of an electronic component mounting device according to the invention. FIG. 5 is a block diagram showing the configuration of the control system of an electronic component mounting device according to the invention. FIGS. 6 and 7 are block diagrams showing the configuration of the mounting head unit of an electronic component mounting device according to the invention.

First, referring to FIG. 1, an explanation will be given of the entire configuration of an electronic component mounting device 1. In FIG. 1, the electronic component mounting device 1 includes two electronic component mounting units 1A and 1B coupled with each other. The structure of the electronic component mounting unit 1A, 1B will be explained below. Since the electronic component mounting units 1A and 1B have the same structure, that of only the electronic mounting unit 1A will be explained.

At the center of the electronic mounting unit 1A, transfer passages 2 are arranged in an X direction. The transfer passages 2 transfer and position a substrate 3 at the mounting position of an electronic component. The transfer passage 2 serves as a substrate positioning section. On both sides of the transfer passages 2, component supply sections 4 are arranged. Each component supply section 4 is provided with a large number of tape feeders 5 which are arranged in parallel. The tape feeders 5 store electronic components held on tapes and feed the tapes by a pitch to supply the electronic components.

On both ends of the electronic component mounting unit 1A, Y-axis tables 6A and 6B are arranged. Two X-axis tables 7A and 7B are erected on the Y-axis tables 6A and 6B. By driving the Y-axis table 6A, the X-axis table 7A is horizontally shifted in the Y direction. By driving the Y-axis table 6B, the X-axis table 7B is horizontally shifted in the Y direction. Each of the X-axis tables 7A and 7B is provided with a mounting head 8 and a camera 9 which moves integrally to the mounting head 8.

By driving the Y-axis table 6A, X-axis table 7A, Y-axis table 6B and the X-axis table 7B in their combination, the mounting heads 8 are horizontally shifted so that the electronic components are picked up from the corresponding component supply sections 4 with the aid of adsorption nozzles and mounted on the substrate 3 positioned on the transfer passage. The camera 9 is moved above the substrate 3, and images and recognizes the substrate 3. On a path from the component supply section 4 to the transfer passage 2, a line camera 10 is arranged. The line camera 10 images the electronic component held in the corresponding mounting head 8 from below.

Referring to FIGS. 2A to 4B, the mounting head 8 will be explained. The electronic component mounting device of the embodiment to the invention is designed to be able to use plural kinds of head units, The mounting head unit is a multiple type mounting head including a plurality of mounting heads each having an adsorption nozzle for adsorbing/holding an electronic component. The mounting head unit is removably mounted on the electronic component mounting device. In this embodiment, two kinds of mounting head units inclusive of a first mounting head unit 8A and a second mounting head unit 8B can be compatibly mounted so that they are replaced by each other according to a substrate and an electronic component directed to mounting.

As shown in FIGS. 2A and 2B, on a head bracket 7a of the X-axis table 7A (7B), a first mounting head unit 8A or a second mounting head unit 8B is mounted.

FIG. 3A shows a front view of the first mounting unit 8A mounted on the head mounting brackets 7a, and FIG. 3B is a cross-sectional view taken along line III—III of FIG. 3A.

Figure 4B:
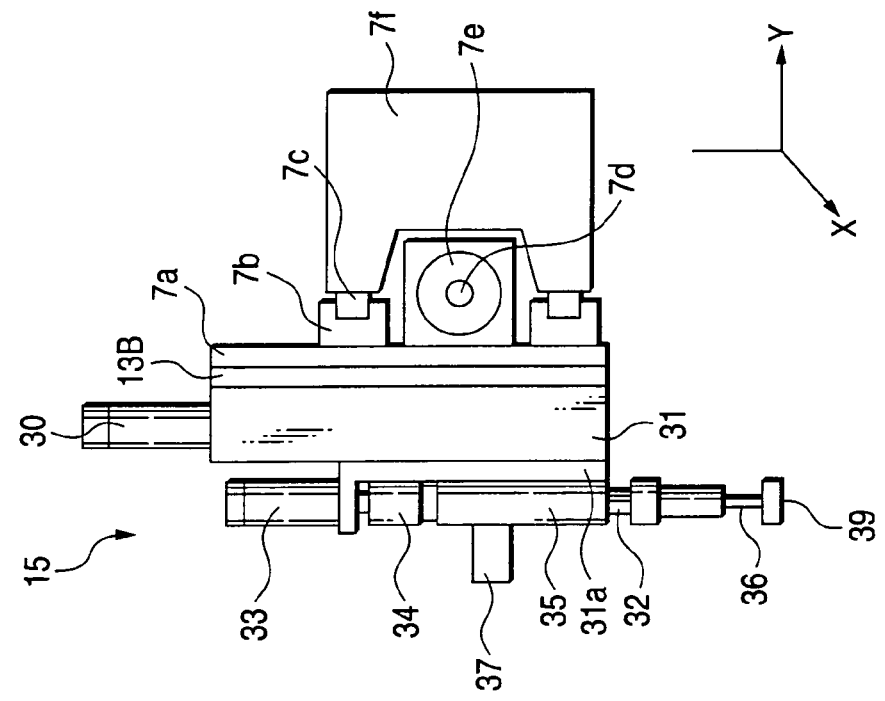
FIGS. 4A and 4B are views showing the structure of a mounting head unit of an electronic component mounting device according to the embodiment of the invention.
Figure 4A:
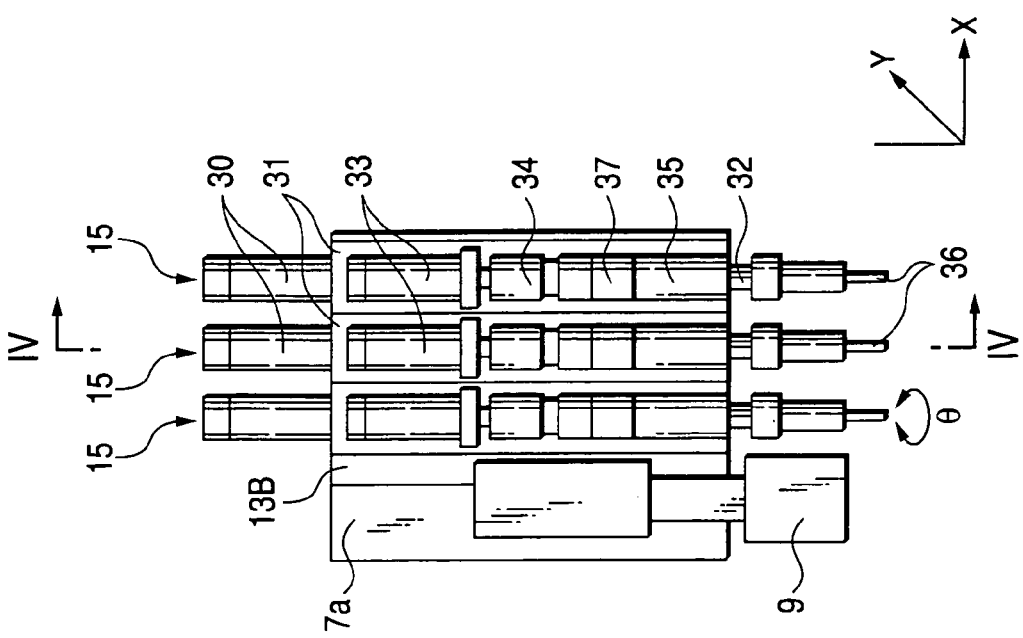

FIG. 4A shows a front view of the second mounting unit 8B attached to the head mounting brackets 7b, and FIG. 3B is a cross-sectional view taken along line IV—IV of FIG. 4A.

As shown in FIGS. 3A to 4B, on the back of the head mounting bracket 7a, slide guides 7b are fixed. The slide guides 7b are horizontally slidable along guide rails 7c arranged on a beam 7f. By rotating a feed screw 7d screwed to a nut member 7e connected to the head mounting bracket 7a by an X-axis motor (not shown), the head mounting bracket 7a is horizontally shifted in the X direction. Therefore, the first mounting head unit 8A or the second mounting head unit 8B is horizontally shifted along the beam 7f.

The first mounting head unit 8A is a multiple type head unit in which a mounting mechanism portion 8a including eight unit mounting heads 14 which are mainly directed to electronic components each having a generalized size and a limited size. The mounting mechanism 8a is connected to a base plate 13A. In such a configuration, a large number of electronic components to be simultaneously taken out and mounted on the substrate in a single mounting turn during which the first mounting head unit 8A travels between the component supply section 4 and the substrate 3, thereby realizing a high speed and high efficiency mounting operation.

On the other hand, the second mounting head unit 8B is a multiple type head unit in which a mounting mechanism portion 8b including three unit mounting heads 15 which are directed to a wide variety of electronic components from small components to large components. The mounting mechanism 8b is connected to a base plate 13B. In such a configuration, a wide variety of electronic components can be mounted by the same mounting head unit. In addition, since the size of the unit mounting head 15 is not severely limited, various additional functions such as a load applying portion capable of optionally setting mounting load as described later can be incorporated. In short, the second mounting head unit 8B is a mounting head unit capable of dealing with a wide variety of components and equipped with a sophisticated function.

Incidentally, the arrangements of bolt holes for mounting the base plates 13A and 13B are common to each other. Both can be compatibly arranged on the head mounting bracket 7a of the X-axis table 7A(7B) by bolting.

The first mounting head unit 8A and the second mounting head unit 8B are designed so that the mounting mechanisms 8a and 8b which execute a mounting operation by the unit mounting heads 14 and 15 are provided with control boards 16A and 16B, respectively. The control boards 16A and 16B have functions of controlling the corresponding mounting mechanism portions 8a and 8b as described later to control the operation of the first mounting head unit 8A and the second mounting head unit 8B according to commands from a main unit control section 40 (FIG. 5).

The mounting mechanism portions 8a and 8b are controlled by the control signals from the corresponding control boards 16A and 16B, respectively, and use, as driving force, the power and air supplied from an electronic component mounting device body. A power supply wiring and an air piping which supply the driving force are connected to head side connecting portions 11 which are collected connectors, together with signal wirings connected to the control boards 16A and 16B. The moving beam of the X-axis table 7A (7B) is likewise provided with the power supply wiring, air piping and signal wiring. These piping and wirings are connected to the beam side connecting portion 11 (see signal wiring 12a, power supply wiring 12b and air piping 12c in FIGS. 6 and 7).

Where the first mounting head unit 8A and the second mounting head unit 8B are mounted on the moving beam of the X-axis table 7A(7B), the base plates 13A and 13B are mounted on the head mounting brackets 7a by bolting, and the head side connecting portion 12 and the beam side connecting portion 11 are coupled with each other. Thus, connection of the power supply wiring, air piping and signal wiring can be completed.

Referring to FIGS. 3A and 3B, the structure of the first mounting head unit 8A will be explained below. A holding member 21 is attached to the front surface of the base plate 13A. The eight unit mounting heads 14 are held upright in an arrangement of 4×2 by the holding member 21. On each of the unit mounting heads 14, a nozzle ascending/descending motor 20 is arranged. By rotating the nozzle ascending/descending motor 20, the corresponding nozzle axis 22 ascends/descends. Further, the first mounting head unit 8A is provided with a nozzle θ rotary motor 23. The rotation of the nozzle θ rotary motor 23 is transmitted to an axis rotating mechanism 25 through a belt 24, and thereby the rotation in the θ direction of rotating the nozzle 22 around its axial center is transmitted to each nozzle axis 22.

An adsorption nozzle 26 is attached to the lower end of the nozzle axis 22. By opening/closing an adsorption valve 27 attached to each unit mounting head 14, the adsorption nozzle 26 can hold adsorption of an electronic component 29 and cancel the adsorption. By shifting the unit mounting head 14 equipped with the adsorption nozzle 26 to the component supply section 4, lowering the adsorption nozzle 26 toward the tape feeder 5, and by opening/closing the adsorption valve 27 for vacuum adsorption from the adsorption nozzle 26, the electronic component 29 can be picked up by the unit mounting head 14.

Further, by rotating the nozzle axis 22 of the unit mounting head 14 which holds the electronic component 29 using the nozzle rotating motor 23, the electronic component 29 can be rotationally aligned. Thereafter, by lowering the adsorption nozzle 26 onto the substrate 3 and opening/closing the adsorption valve 27 to stop the vacuum adsorption from the adsorption nozzle 26, the held electronic component 29 can be loaded on the substrate 3.

Namely, the adsorption nozzle 26 serves as a component holding unit for holding the electronic component. The nozzle ascending/descending motor 20, nozzle θ rotation motor 23 and adsorption valve 27 constitute a mounting operation mechanism which allows the adsorption nozzle 26 to execute the mounting operation inclusive of the pick-up operation of the electronic component, rotational aligning operation and loading operation. Incidentally, as the electronic component holding means, the other technique than the vacuum adsorption may be adopted. For example, the means which mechanically clamps and holds the electronic component may be adopted. Further, the nozzle θ rotation motor 23 may be omitted from the mounting operation mechanism.

Referring to FIGS. 4A and 4B, the second mounting head unit 8B may be explained below. On the base plate 13B, the three unit mounting heads 15 are arranged with the same arrangement pitch. Each unit mounting head 15 has an ascending/descending table 31 equipped with a nozzle ascending/descending motor 30. The ascending/descending table 31 is provided with an ascending/descending bracket 31a with the front surface of which a holding member 35 is coupled.

The holding member 35 rotatably holds a nozzle axial portion 32 on the lower end of which an adsorption nozzle 36 is mounted. The rotation of a nozzle θ rotation motor 33 is transmitted to the adsorption nozzle 36 through a load applying portion 34 and a nozzle axial portion 32, thereby θ-rotating the adsorption nozzle 36 around the axial center. The load applying portion 34 has a function of applying desired pressing load to the adsorption nozzle 36 to set mounting load suited to the electronic component to be mounted.

Each unit mounting head 15 is provided with an adsorption valve 37. By opening/closing the adsorption valve 37, the vacuum adsorption from the adsorption nozzle 36 and its release are carried out so that the adsorption holding and its release of the electronic component 39 can be made with the aid of the adsorption nozzle 36. Like the unit mounting head 14, the unit mounting head 15 can perform the pickup operation of picking up the electronic component 39 from the component supply section 4 and the loading operation of loading the electronic component 39 on the substrate 39.

Namely, the adsorption nozzle 36 serves as a component holding means for holding the electronic component. Further, the nozzle ascending/descending motor 30, nozzle θ rotation motor 33 and adsorption valve 37 constitute a mounting operation mechanism which allows the adsorption nozzle 36 to execute the mounting operation inclusive of the pick-up operation of the electronic component and loading operation.

Referring to FIG. 5, an explanation will be given of the control system of an electronic component mounting device. In FIG. 5, a main unit control section 40 is an entirety control device for controlling the entire operation of the electronic component mounting device 1. This main unit control section 40 is installed within a control board attached to the device main unit. The main unit control section 40 includes a CPU 41, a program storage portion 42, a data storage portion 43, a recognition processing portion 44, a mechanism control portion 45 and a head operation command portion 46. The CPU 41 is a computing device which executes various programs stored in the program storage portion 42 to control the following respective portions, thereby controlling the operation such as the mounting operation and computing operation. In executing the programs, various data stored in the data storage portion 43 are referred to.

The data storage portion 43 stores, for each kind of the mounting head units, mounting data such as mounting coordinate data for the substrate for mounting and data relative to the electronic component to be mounted, and also stores control parameters necessary to control the mounting operation of the mounting head units 8A and 8B. The recognition processing portion 44 recognizes/processes the imaging result of the camera 9 to recognize the position of the substrate 3 and recognizes/processes the imaging result of the line camera 10 to recognize the electronic component held by the mounting head 8. The mechanism control portion 45 controls the operation of the mechanism portions such as a conveyer mechanism on a transfer passage 2, X-axis tables 7A, 7B and Y-axis tables 6A, 6B.

The head operation command portion 46 issues operation commands for the command board 16A (16B) of each mounting head unit 8A (8B) mounted on the X-axis table 7A, 7B. The head operation command portion 46 issues, for each unit mounting head 14, 15, a timing signal of starting the pick-up operation and loading operation and a signal indicative of the quantity of the θ rotation of the nozzle axis.

Now referring to FIGS. 6 and 7, an explanation will be given of the configurations of the control systems for the mounting head units 8A and 8B. FIG. 6 shows the configuration of the first mounting head unit 8A. A control board 16A is a head control portion for controlling the mounting operation mechanism on the basis of an operation command from the main unit control section 40, and includes an MPU 16a, memory 16b, a motor driving portion 16c, a valve driving portion 16d, signal detecting portion 16e and a communication portion 16f.

A signal wiring 12a connected to the communication portion 16f couples the head side connecting portion 12 and beam side connecting portion 11 so that the communication portion 16f is connected to the main unit control section 40. Since the head side connecting portion 12 and beam side connecting portion 11 are coupled with each other, the first mounting head unit 8A is supplied with a driving power through the power supply wiring 12b and with air for driving a vacuum adsorption source and breaking vacuum through the air piping 12c.

The MPU 16a is a computing device which controls the motor driving portion 16c, valve driving portion 16d and signal detecting portion 16e according to an operation command transmitted from the main unit control section 40 through the communication portion 16f on the basis of the program and data stored in the memory 16b. The memory 16b stores the program and data corresponding to the unit mounting head 14 to be controlled. By this control, the mounting operation of the individual unit mounting head 14 is controlled.

Specifically, when the operation command from the main unit control section 40 is transmitted to the control board 16A, the motor driving portion 16c drives the nozzle rotation motor 23 and the nozzle ascending/descending motor 20 of the unit mounting head 14 to be controlled; the valve driving portion 16d drives the adsorption valve 27 of the unit mounting head 14 to be controlled; and the signal detecting portion 16e detects signals from a detecting portion 28 such as a sensor of the unit mounting head 14 to be controlled and encoder attached to each motor. In this way, the mounting operation is carried out in such a manner that the adsorption nozzle 26 picks up electronic component, makes necessary θ rotation and loads it on the substrate.

FIG. 7 shows the second mounting head unit 8B. The second mounting head unit 8B is different from the first mounting head unit 8A shown in FIG. 6 in that each unit mounting head 15 is individually provided with a nozzle e rotation motor 33. In this example also, the head side connecting portion 12 and the beam side connecting portion 11 are coupled with each other so that the control board 16B is connected to the main unit control section 40.

The control board 16B controls the nozzle θ rotation motor 33, nozzle ascending/descending motor 30, adsorption valve 37 and detecting portion 38 according to the operation command from the main unit control section 40. In this way, as explained in connection with FIG. 6, the mounting operation is carried out in such a manner that the adsorption nozzle 36 picks up electronic component, makes necessary θ rotation therefor and loads it on the substrate.

By employing the electronic component mounting device and the mounting head unit structured described above, the following meritorious effects can be obtained. First, the mounting head unit according to this embodiment is freely removable from the electronic component mounting device, and also easily replaced by another mounting head unit. Therefore, by preparing these plurality of mounting head units, the same electronic component mounting device can be used with a different device performance corresponding to the substrate to be produced. Specifically, where a high speed/high efficiency mounting operation is to be implemented, the first mounting head unit 8A is employed. Where the mounting device is employed as a device capable of dealing with a wide variety of components and equipped with a sophisticated function, the second mounting head unit 8B is employed. It is of course that the mounting head unit of the other kind having the other performance may be employed.

In replacement of the mounting head, in the conventional electronic component mounting device, the actuator such as the motor and valve, various sensors, etc. attached to the mounting head must be connected to the main unit control section arranged fixedly. Therefore, in replacing the mounting head, replacement of the connection of these large number of complicated wirings must be made for each time. Thus, conventionally, it was actually very difficult to exchange the different kinds of mounting heads by the same electronic component mounting device at a high frequency.

On the other hand, in this embodiment of this inventions since each mounting head unit is provided with a dedicated control board, in the replacement of the connection of wirings and others in replacement of the mounting head unit, a very small number of wirings and others such as the power source wiring, signal wiring and air piping have only to be made. Thus, the replacement of connection can be completed by simple connector attachment/detachment operation.

Further, in a control system for the conventional electronic component mounting device, a large number of objects to be controlled such as a plurality of mounting heads and substrate transfer mechanism were wholly controlled by a single main unit control section. Therefore, the main unit control section processes a large quantity of signals for controlling them in parallel so that the time delay in the signal processing was inevitable. As a result, the mounting operation by the adsorption nozzle led to response delay so that there was a limit to speeding up the mounting operation.

On the other hand, in this embodiment of this invention, the mounting operation mechanism such as the nozzle ascending/descending motor and adsorption valve are controlled by the control board dedicated to each mounting head unit. For this reason, the time delay in signal processing is so small that the high speed mounting operation can be realized.

In accordance with this invention, the mounting head unit removably mounted in the electronic component mounting device includes a component holding means for holding an electronic component, a mounting operation mechanism for causing the component holding means to make a mounting operation inclusive of the pick-up operation and loading operation; and a head control section for controlling the mounting operation mechanism on the basis of an operation command from the main unit control section for controlling the entire operation of the electronic component mounting device. In such a configuration, replacement of the mounting head can be easily made and the high speed mounting operation can be realized.

What is claimed is:

1. An electronic component mounting device for taking out an electronic component from a component supply section and shifting and loading the electronic component to a substrate, comprising:
   a substrate positioning section for positioning the substrate;
   a mounting head unit detachably mounted onto the electronic component mounting device for making a pick-up operation of picking up and holding the electronic component from the component supply section and a loading operation of loading the electronic component thus held on the substrate; and a main unit control section for controlling an entire operation of the electronic component mounting device, wherein the mounting head unit comprises:

a component holding unit for holding the electronic component;

a mounting operation mechanism for allowing the component holding unit to make a mounting operation including the pick-up operation and loading operation; and a head control section for controlling the mounting operation mechanism on the basis of an operation command from the main unit control section.

2. The electronic component mounting device according to claim 1, wherein the mounting head unit has a plurality of mounting heads, and each of the mounting heads is equipped with the component holding unit for holding the electronic component.

3. The electronic component mounting device according to claim 1, wherein the mounting head unit can be replaceably employed according to a substrate and component directed to mounting.

4. The electronic component mounting device according to claim 1, further comprising:

a first power source wiring;

a first air wiring; and a first signal wiring, wherein the mounting head unit further comprises:

a second power source wiring connected to the first power source wiring;

a second air wiring connected to the first air wiring; and a second signal wiring connected to the first signal wiring.

5. The electronic component mounting device according to claim 1, wherein the main unit control section comprises a data storage portion for storing a control parameter, for each kind of the mounting head unit, to control the mounting operation of the mounting head unit.

6. An electronic component mounting device according to claim 1, wherein the main unit control section comprises a head operation command portion which issues a head operation command to a head control portion of the mounting head unit.

7. The electronic component mounting device according to claim 1, wherein the mounting head unit is a multiple type head unit has a plurality of mounting heads and wherein each of the plurality of mounting heads can mount a different sized component.

8. The electronic component mounting device according to claim 1, wherein the mounting operation mechanism further includes a nozzle rotational alignment operation.

9. A mounting head unit for an electronic component comprising:

a component holding unit for holding an electronic component;

a mounting operation mechanism for allowing the component holding unit to make a mounting operation inclusive of a pick-up operation and a loading operation, a pick-up operation being picking up and holding the electronic component from a component supply section and a loading operation being loading the electronic component on a substrate in an electronic component mounting device; and a head control section for controlling the mounting operation mechanism based on an operation command from a main unit control section which controls an entire operation of the electronic component mounting device, wherein the mounting head unit is detachably mounted on the electronic component mounting device.

10. The mounting head unit for an electronic component according to claim 9, wherein the mounting head unit has a plurality of mounting heads, and each of the mounting heads is equipped with the component holding unit for holding the electronic component.

11. The mounting head unit for an electronic component according to claim 9, wherein the head control portion detects signals from a detecting portion inclusive of a sensor of a unit mounting head and an encoder attached to a motor.

12. The electronic component mounting device according to claim 9, wherein the mounting head unit is a multiple type head unit having a plurality of mounting heads and wherein each of the plurality of mounting heads can mount a different sized component.

13. The electronic component mounting device according to claim 9, wherein the mounting operation mechanism further includes a nozzle rotational alignment operation.

* * * * *